US011200923B2

(12) United States Patent
Ku et al.

(10) Patent No.: US 11,200,923 B2
(45) Date of Patent: Dec. 14, 2021

(54) SEMICONDUCTOR APPARATUS

(71) Applicant: SK hynix Inc., Gyeonggi-do (KR)

(72) Inventors: Sang Hyun Ku, Gyeonggi-do (KR); Sung Soo Chi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 195 days.

(21) Appl. No.: 16/238,198

(22) Filed: Jan. 2, 2019

(65) Prior Publication Data
US 2019/0348086 A1    Nov. 14, 2019

(30) Foreign Application Priority Data

May 8, 2018    (KR) .................. 10-2018-0052755

(51) Int. Cl.
| | |
|---|---|
| *G11C 7/10* | (2006.01) |
| *G11C 5/02* | (2006.01) |
| *G11C 29/56* | (2006.01) |
| *G11C 29/02* | (2006.01) |
| *H03B 5/12* | (2006.01) |

(52) U.S. Cl.
CPC .............. *G11C 7/1063* (2013.01); *G11C 5/02* (2013.01); *G11C 29/023* (2013.01); *G11C 29/028* (2013.01); *G11C 29/56012* (2013.01); *H03B 5/1271* (2013.01); *G11C 2207/2254* (2013.01)

(58) Field of Classification Search
CPC ....... G11C 7/1084; G11C 7/1063; G11C 5/02; G11C 2207/2254; G11C 29/023; G11C 29/028; G11C 29/56012; H01L 25/18; H03B 5/04; H03B 5/1271
USPC ...... 257/315, 738, 774; 327/365; 331/108 C; 716/120
See application file for complete search history.

(56) References Cited

U.S. PATENT DOCUMENTS

| | | | |
|---|---|---|---|
| 7,782,078 B2 | 8/2010 | Koo | |
| 9,256,246 B1* | 2/2016 | Lim | ............. G06F 1/10 |
| 9,569,389 B2* | 2/2017 | Jeon | ......... G06F 13/382 |
| 2014/0368249 A1 | 12/2014 | Lee | |

FOREIGN PATENT DOCUMENTS

KR    1020140078261    6/2014

* cited by examiner

*Primary Examiner* — Arnold M Kinkead
(74) *Attorney, Agent, or Firm* — IP & T Group LLP

(57) ABSTRACT

A semiconductor apparatus includes a first chip that generates a first oscillator signal in response to a detection enable signal and activates a ZQ circuit in response to a ZQ enable signal, and a second chip generates the ZQ enable signal by comparing frequencies of the first oscillator signal and a second oscillator signal with each other in response to the detection enable signal.

18 Claims, 6 Drawing Sheets

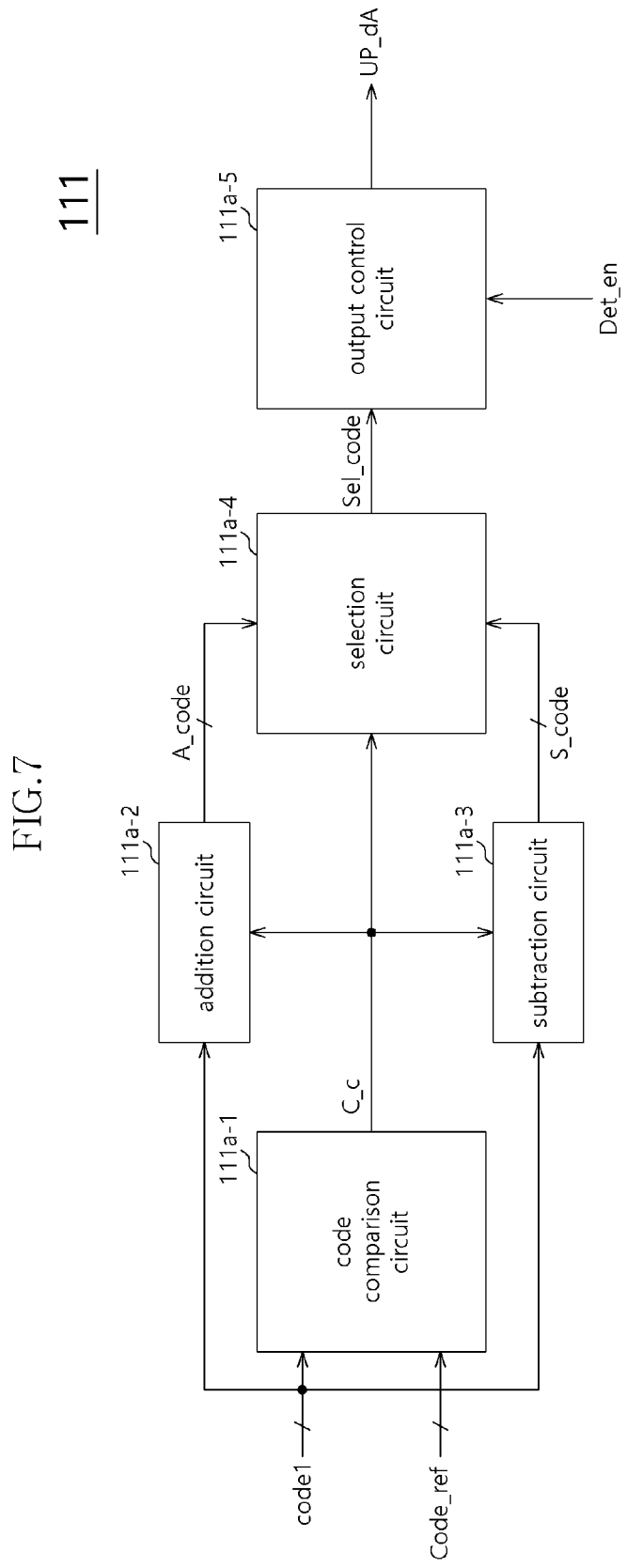

SEMICONDUCTOR APPARATUS

CROSS-REFERENCE TO RELATED APPLICATION

The present application claims priority under 35 U.S.C. § 119(a) to Korean application number 10-2018-0052755, filed on May 8, 2018, in the Korean Intellectual Property Office, which is incorporated herein by reference in its entirety.

BACKGROUND

1. Technical Field

Various embodiments of the present invention generally relate to a semiconductor integrated circuit. Particularly, the embodiments relate to a semiconductor apparatus.

2. Related Art

A semiconductor apparatus may be formed in a stack structure of a plurality of single chips due to its integration.

Since each of the stacked chips may differ in operation environments and processes, the operating speeds of the stacked chips may be different from each other.

Since levels of voltages applied to each of the stacked chips may be different from one another and temperatures of the chips may be different from one another, the operating speeds of the stacked chips may be different from each other.

SUMMARY

A semiconductor apparatus capable of controlling operation speeds of stacked chips to be the same as one another is described herein.

In an embodiment, a semiconductor apparatus includes: a first chip that generates a first oscillator signal in response to a detection enable signal and activates a impedance adjusting circuit in response to a enable signal; and a second chip that generates the enable signal by comparing frequencies of the first oscillator signal and a second oscillator signal with each other in response to the detection enable signal, wherein the first chip transfers the first oscillator signal to the second chip through a through electrode and the second chip transfers the enable signal to the first chip through the through electrode.

In an embodiment, a semiconductor apparatus includes: a first chip configured to generate a first oscillator signal, and a second chip stacked on the first chip, configured to generate a second oscillator signal. The first chip is configured to generate a first oscillator signal, compare the second oscillator signal and the first oscillator signal with each other, and output a comparison result to the second chip. The first and second chips are electrically connected to each other by at least one through electrode.

In an embodiment, a semiconductor apparatus includes: a first chip that generates a calibration code in response to a detection enable signal and controls a signal transfer time in the first chip in response to an update signal; and a second chip that generates the update signal by comparing a reference code and the calibration code with each other, wherein the first chip transfers the calibration code to the second chip through a through electrode and the second chip transfers the update signal to the first chip through the through electrode.

In an embodiment, a semiconductor apparatus includes: a first chip, and a second chip electrically connected to a first chip through a through electrode. The first chip is configured to compare a calibration code generated from the second chip and a reference code with each other and outputs a comparison result to the second chip.

In an embodiment, a semiconductor apparatus includes: a first chip configured to generate a representative signal representing an internal signal travelling therein, and a second chip configured to control the first chip to adjust, through a calibration, an internal transfer time of the internal signal by an amount corresponding to discrepancy between the representative signal and a reference signal.

In the semiconductor apparatus in accordance with the embodiment, stacked chips are allowed to operate at substantially the same operation speeds, so that it is possible to improve operation performance of the semiconductor apparatus and reduce current consumption thereof.

BRIEF DESCRIPTION OF THE DRAWINGS

FIG. 7 is a configuration diagram of a first update generation circuit of FIG. 6.

DETAILED DESCRIPTION

The technical spirit of the present disclosure may be changed in various manners, and may be implemented as embodiments having various aspects. Hereinafter, the present disclosure will be described by way of some embodiments so that those skilled in the art can easily practice the embodiments of the present disclosure. It is noted that reference to "an embodiment" does not necessarily mean only one embodiment, and different references to "an embodiment" are not necessarily to the same embodiment(s).

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof.

Hereinafter, a semiconductor apparatus will be described below with reference to the accompanying drawings through various examples of embodiments.

Figure 1:
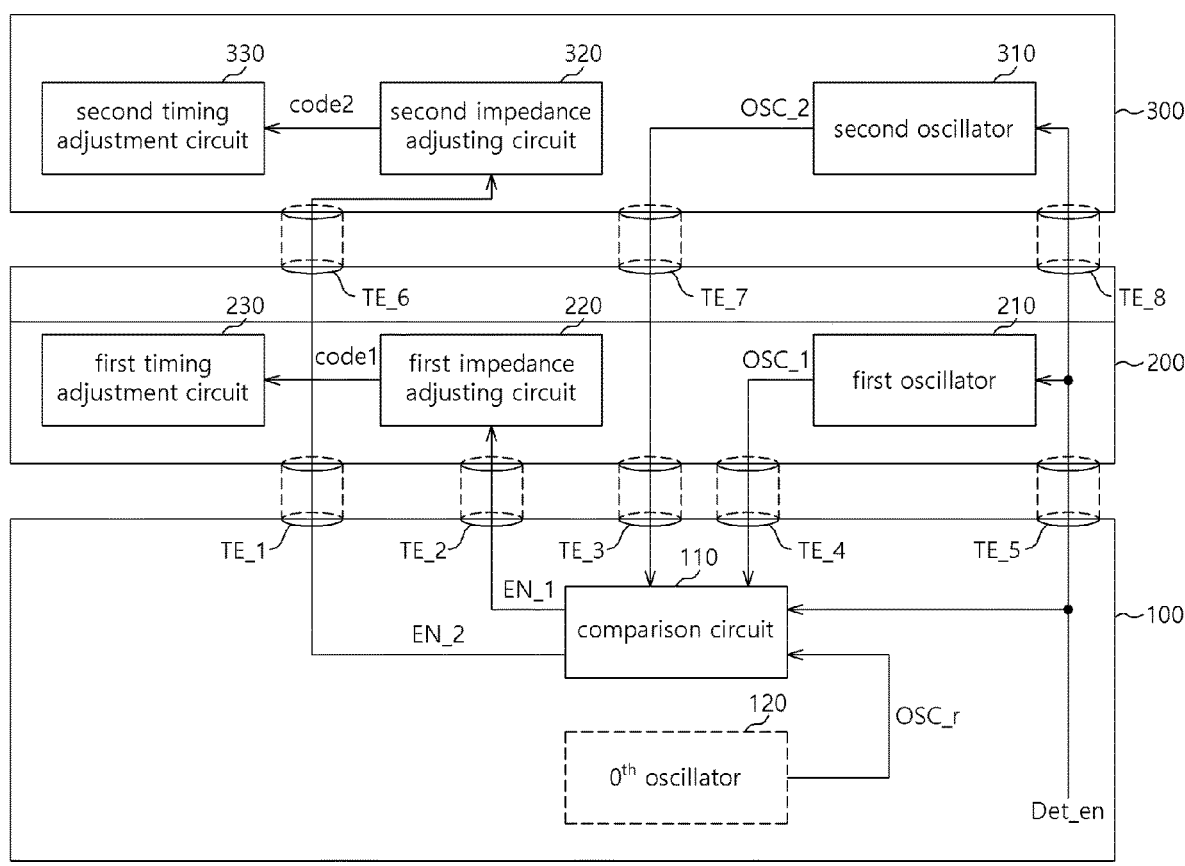
FIG. 1 is a configuration diagram of a semiconductor apparatus in accordance with an embodiment of the present invention.

FIG. 1 is a configuration diagram of a semiconductor apparatus 400 in accordance with an embodiment of the present invention.

Referring to FIG. 1, the semiconductor apparatus 400 in accordance with an embodiment may include first to third chips 100, 200, and 300 stacked through a plurality of through electrodes TE_1 to TE_8. The through electrodes TE_1 to TE_8 may include all elements that electrically connect chips to one another as with a through-silicon via (TSV), a micro bump and the like.

The first to third chips 100, 200, and 300 may be electrically connected to one another through the plurality of through electrodes TE_1 to TE_8, and may be stacked on one another. The first chip 100 may be electrically connected to an external control circuit (for example, a controller), and may electrically connect the external control circuit and the second and third chips 200 and 300 to one another. Each of the plurality of through electrodes TE_1 to TE_8 may be disposed among different chips to transfer a signal.

The first chip 100 may include a comparison circuit 110.

When a detection enable signal Det_en is enabled, the comparison circuit 110 may compare each of a first oscillator signal OSC_1 and a second oscillator signal OSC_2 transferred from the second and third chips 200 and 300 with a $0^{th}$ oscillator signal OSC_r. The comparison circuit 110 may provide first and second enable signals EN_1 and EN_2 to the second and third chips 200 and 300 based on the results of the comparison, respectively.

For example, when the detection enable signal Det_en is enabled, the comparison circuit 110 may compare the frequencies of the $0^{th}$ oscillator signal OSC_r and the first oscillator signal OSC_1 with each other, thereby generating the first enable signal EN_1. When the detection enable signal Det_en is enabled, the comparison circuit 110 may compare the frequencies of the $0^{th}$ oscillator signal OSC_r and the second oscillator signal OSC_2 with each other, thereby generating the second enable signal EN_2.

The $0^{th}$ oscillator signal OSC_r may have a constant frequency regardless of variation in temperature and voltage, and the first and second oscillator signals OSC_1 and OSC_2 may have the frequencies varying according to a change in temperature and voltage. The detection enable signal Det_en may be generated by a command received from the external control circuit.

The first chip 100 may further include a $0^{th}$ oscillator 120. The $0^{th}$ oscillator 120 may generate the $0^{th}$ oscillator signal OSC_r.

Accordingly, when the detection enable signal Det_en is enabled, the first chip 100 may compare each of the first and second oscillator signals OSC_1 and OSC_2 transferred from the second and third chips 200 and 300 with the $0^{th}$ oscillator signal OSC_r, and respectively provide the first and second enable signals EN_1 and EN_2 to the second and third chips 200 and 300.

The second chip 200 may receive the detection enable signal Det_en and the first enable signal EN_1 from the first chip 100, and provide the first oscillator signal OSC_1 to the first chip 100.

The second chip 200 may include a first oscillator 210, a first impedance adjusting circuit 220, and a first timing adjustment circuit 230.

The first oscillator 210 may generate the first oscillator signal OSC_1 when the detection enable signal Det_en is enabled. In such a case, the first oscillator 210 may generate the first oscillator signal OSC_1 having the frequency depending on variations in voltage and temperature.

The first impedance adjusting circuit 220 may generate a first calibration code code1 when the first enable signal EN_1 is enabled. The first impedance adjusting circuit 220 may include a calibration circuit.

The first timing adjustment circuit 230 may control transfer timings of signals travelling within the second chip 200, in response to the first calibration code code1. For example, when a code value of the first calibration code code1 increases, the first timing adjustment circuit 230 may increase or decrease transfer times of signals travelling within the second chip 200.

The third chip 300 may receive the detection enable signal Det_en and the second enable signal EN_2 from the first chip 100, and provide the second oscillator signal OSC_2 to the first chip 100.

The third chip 300 may include a second oscillator 310, a second impedance adjusting circuit 320, and a second timing adjustment circuit 330.

The second oscillator 310 may generate the second oscillator signal OSC_2 when the detection enable signal Det_en is enabled. In such a case, the second oscillator 310 may generate the second oscillator signal OSC_2 having the frequency depending on variations in voltage and temperature.

The second impedance adjusting circuit 320 may generate a second calibration code code2 when the second enable signal EN_2 is enabled. The second impedance adjusting circuit 320 may include a calibration circuit.

The second timing adjustment circuit 330 may control transfer timings of signals travelling within the third chip 300, in response to the second calibration code code2. For example, when a code value of the second calibration code code2 increases, the second timing adjustment circuit 330 may increase or decrease transfer times of signals travelling within the third chip 300.

The first to fifth through electrodes TE_1 to TE_5 may be disposed between the first chip 100 and the second chip 200, and may transfer signals between the first chip 100 and the second chip 200. The sixth to eighth through electrodes TE_6 to TE_8 may be disposed between the second chip 200 and the third chip 300, and may transfer signals between the second chip 200 and the third chip 300. Through the first and sixth through electrodes TE_1 and TE_6, the second enable signal EN_2 may be transferred from the first chip 100 to the third chip 300 via the second chip 200. Through the second through electrode TE_2, the first enable signal EN_1 may be transferred from the first chip 100 to the second chip 200. Through the third and seventh through electrodes TE_3 and TE_7, the second oscillator signal OSC_2 may be transferred from the third chip 300 to the first chip 100 via the second chip 200. Through the fourth through electrode TE_4, the first oscillator signal OSC_1 may be transferred from the second chip 200 to the first chip 100. Through the fifth and eighth through electrodes TE_5 and TE_8, the detection enable signal Det_en may be transferred from the first chip 100 to the second and third chips 200 and 300.

Figure 2:
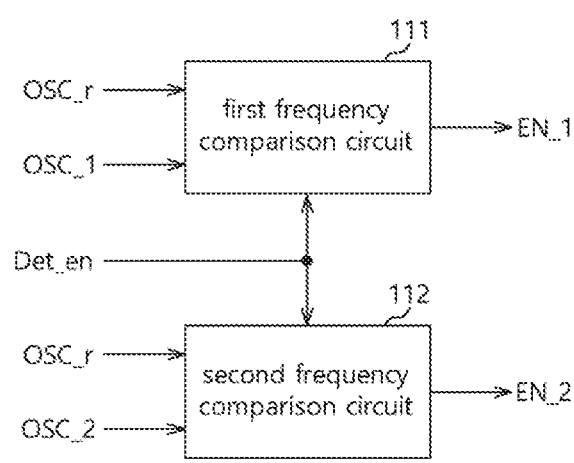
FIG. 2 is a configuration diagram of a comparison circuit of FIG. 1.

FIG. 2 is a configuration diagram of a comparison circuit 110 of FIG. 1.

Referring to FIG. 2, the comparison circuit 110 may include first and second frequency comparison circuits 111 and 112.

The first frequency comparison circuit 111 may generate the first enable signal EN_1 based on the $0^{th}$ oscillator signal OSC_r and the first oscillator signal OSC_1 when the detection enable signal Det_en is enabled. For example, when the detection enable signal Det_en is enabled, if the frequency of the first oscillator signal OSC_1 is outside a predetermined range (for example, 10 Hz) with reference to the frequency of the $0^{th}$ oscillator signal OSC_r, the first frequency comparison circuit 111 enables the first enable signal EN_1. More specifically, when the detection enable signal Det_en is enabled, if the frequency of the first oscillator signal OSC_1 is higher or lower than the predetermined range, 10 Hz, with reference to the frequency of the $0^{th}$ oscillator signal OSC_r, the first frequency comparison circuit 111 enables the first enable signal EN_1.

The second frequency comparison circuit 112 may generate the second enable signal EN_2 in response to the $0^{th}$ oscillator signal OSC_r and the second oscillator signal OSC_2 when the detection enable signal Det_en is enabled. For example, when the detection enable signal Det_en is enabled, if the frequency of the second oscillator signal OSC_2 is outside a predetermined range (for example, 10 Hz) with reference to the frequency of the $0^{th}$ oscillator signal OSC_r, the second frequency comparison circuit 112 enables the second enable signal EN_2. More specifically, when the detection enable signal Det_en is enabled, if the frequency of the second oscillator signal OSC_2 is higher or lower than the predetermined range, 10 Hz, with reference to the frequency of the $0^{th}$ oscillator signal OSC_r, the second frequency comparison circuit 112 enables the second enable signal EN_2.

Other than the input/output signals, the first and second frequency comparison circuits 111 and 112 may have substantially the same configuration.

Figure 3:
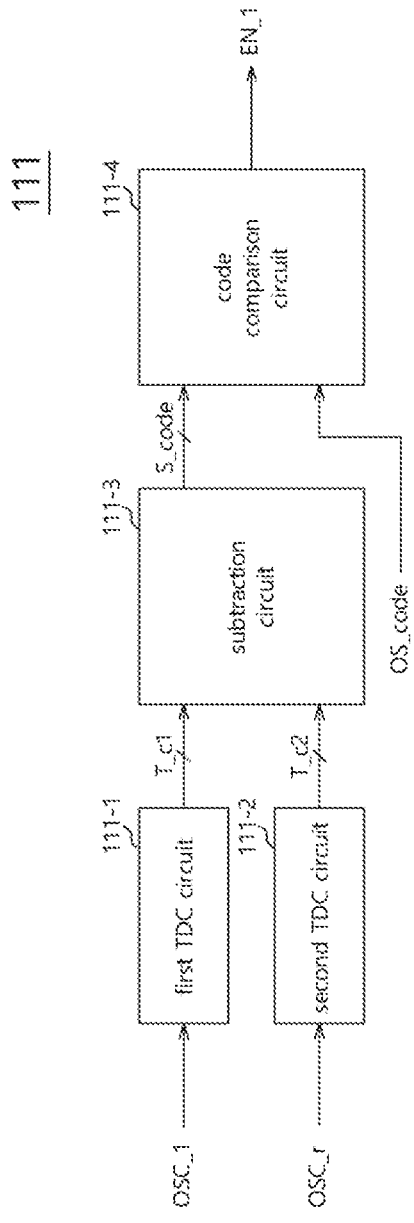
FIG. 3 is a configuration diagram of a first frequency comparison circuit of FIG. 2.
Figure 4:
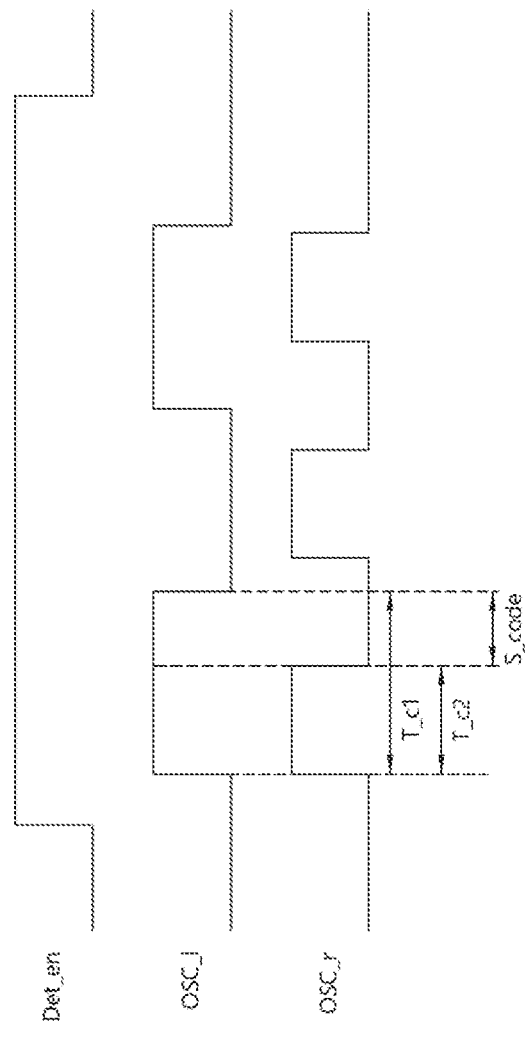
FIG. 4 is a timing diagram for explaining an operation of a first frequency comparison circuit of FIG. 3.

FIG. 3 is a configuration diagram of a first frequency comparison circuit 111 of FIG. 2. FIG. 4 is a timing diagram for explaining an operation of a first frequency comparison circuit 111 of FIG. 3.

Referring to FIG. 3, the first frequency comparison circuit 111 may include first and second TDC (time digital converter) circuits 111-1 and 111-2, a subtraction circuit 111-3, and a code comparison circuit 111-4.

The first TDC circuit 111-1 may generate a first period code T-c1 in response to the first oscillator signal OSC_1. For example, the first TDC circuit 111-1 may generate the first period code T-c1 having a code value corresponding to the period of the first oscillator signal OSC_1. More specifically, referring to FIG. 4, the first TDC circuit 111-1 may generate the first period code T-c1 having a code value corresponding to a duration of a specific level (e.g., a high level) of the first oscillator signal OSC_1.

The second TDC circuit 111-2 may generate a second period code T-c2 in response to the $0^{th}$ oscillator signal OSC_r. For example, the second TDC circuit 111-2 may generate the second period code T-c2 having a code value corresponding to the period of the $0^{th}$ oscillator signal OSC_r. More specifically, referring to FIG. 4, the second TDC circuit 111-2 may generate the second period code T-c2 having a code value corresponding to a duration of a specific level (e.g., a high level) of the $0^{th}$ oscillator signal OSC_r. Each of the first and second TDC circuits 111-1 and 111-2 may include a time to digital converter.

The subtraction circuit 111-3 may generate a subtraction code S-code by performing a subtraction operation on the first period code T-c1 and the second period code T-c2. As illustrated in FIG. 4, a code value of the subtraction code S-code may correspond to a difference between the frequency of the first oscillator signal OSC_1 and the frequency of the $0^{th}$ oscillator signal OSC_r.

The code comparison circuit 111-4 may generate the first enable signal EN_1 by comparing the subtraction code S-code and an offset code OS_code with each other. For example, when the code value of the subtraction code S-code is larger than that of the offset code OS_code, the code comparison circuit 111-4 may enable the first enable signal EN_1. When the code value of the subtraction code S-code is smaller than that of the offset code OS_code, the code comparison circuit 111-4 may disable the first enable signal EN_1.

When the frequency of the first oscillator signal OSC_1 is oustdie a predetermined range with reference to the frequency of the $0^{th}$ oscillator signal OSC_r, that is, when a code value of the first period code T-c1 obtained by converting the frequency of the first oscillator signal OSC_1 is larger than the code value of the second period code T-c2 obtained by converting the frequency of the $0^{th}$ oscillator signal OSC_r by an amount of the code value of the offset code OS_code, the first frequency comparison circuit 111 may enable the first enable signal EN_1.

Other than the input/output signals, the first and second frequency comparison circuits 111 and 112 may have substantially the same configuration. Thus, detailed descriptions of the comparison circuit 112 will be omitted herein.

Hereinafter, an operation of the semiconductor apparatus 400 described with reference to FIGS. 1 to 4 in accordance with the embodiment present invention will be described.

A command or a signal for enabling the detection enable signal Det_en may be inputted to the semiconductor apparatus 400 externally.

Although FIGS. 1 to 4 exemplify the semiconductor apparatus 400 including a stack structure of the three chips 100, 200, and 300, the embodiment is not limited thereto. That is, the number of chips stacked may vary depending on the design requirement.

When the detection enable signal Det_en is enabled, the first chip 100 may compare each of the frequencies of the first and second oscillator signals OSC_1 and OSC_2 transferred from the second and third chips 200 and 300 with the frequency of the $0^{th}$ oscillator signal OSC_r. The first chip 100 may transfer the comparison results to the second and third chips 200 and 300 as the first and second enable signals EN_1 and EN_2, respectively.

Hereinafter, an operation of each chip will be described more specifically.

When the detection enable signal Det_en is enabled, the first oscillator 210 of the second chip 200 generates the first oscillator signal OSC_1 having the frequency depending on variations in temperature or voltage, and provides the first oscillator signal OSC_1 to the first chip 100.

When the detection enable signal Det_en is enabled, the second oscillator 310 of the third chip 300 generates the second oscillator signal OSC_2 having the frequency depending on variations in temperature or voltage, and provides the second oscillator signal OSC_2 to the first chip 100.

When the detection enable signal Det_en is enabled, the first chip 100 may compare each of the first and second oscillator signals OSC_1 and OSC_2 transferred from the second and third chips 200 and 300 with the $0^{th}$ oscillator signal OSC_r. The first chip 100 may transfer the comparison results to the second and third chips 200 and 300 as the first and second enable signals EN_1 and EN_2, respectively.

The first chip 100 includes the comparison circuit 110 that compares each of the first and second oscillator signals OSC_1 with OSC_2 and the $0^{th}$ oscillator signal OSC_r and generates the first and second enable signals EN_1 and EN_2.

The comparison circuit 110 enables the first enable signal EN_1 when the frequency of the first oscillator signal OSC_1 is outside a predetermined range with reference to the frequency of the $0^{th}$ oscillator signal OSC_r. Furthermore, the comparison circuit 110 enables the second enable signal EN_2 when the frequency of the second oscillator signal OSC_2 is outside the predetermined range with reference to the frequency of the $0^{th}$ oscillator signal OSC_r.

When the first enable signal EN_1 is enabled, the second chip 200 activates the first impedance adjusting circuit 220. The activated first impedance adjusting circuit 220 generates the first calibration code code1. The first calibration code code1 is inputted to the first timing adjustment circuit 230, and the first timing adjustment circuit 230 controls transfer timings of signals travelling within the second chip 200, in response to the first calibration code code1.

When the second enable signal EN_2 is enabled, the third chip 300 activates the second impedance adjusting circuit 320. The activated second impedance adjusting circuit 320 generates the second calibration code code2. The second calibration code code2 is inputted to the second timing adjustment circuit 330, and the second timing adjustment circuit 330 controls transfer timings of signals travelling within the third chip 300, in response to the second calibration code code2.

As described above, the semiconductor apparatus 400 in accordance with the embodiment is configured such that each stacked chip 200 or 300 generates the oscillator signal OSC_1 or OSC_2 having the frequency depending on variations a in voltage and temperature when the detection enable signal Det_en is enabled. The semiconductor apparatus 400 determines whether the oscillator signal OSC_1 or OSC_2 generated in each chip 200 or 300 is a signal having a frequency outside a predetermined range with reference to the frequency of the $0^{th}$ oscillator signal OSC_r, that is, determines whether the frequency change of an internal signal (e.g., the oscillator signal OSC_1 or OSC_2) in each chip 200 or 300 is beyond the preset range, and enables a enable signal EN_1 or EN_2 provided to each chip 200 or 300 when the frequency change is large as beyond the preset range. A chip having received the enabled enable signal EN_1 or EN_2 activates the calibration circuit 220 or 320 to generate the calibration code code1 or code2, and the transfer timings (a delay time, latency and the like) of internal signals are set again in response to the generated calibration code code1 or code2.

As a consequence, the semiconductor apparatus 400 in accordance with the embodiment can allow the operation speeds of the stacked chips to be the same as one another, thereby improving operation performance of the semiconductor apparatus 400 as well as reducing current consumption thereof.

Figure 5:
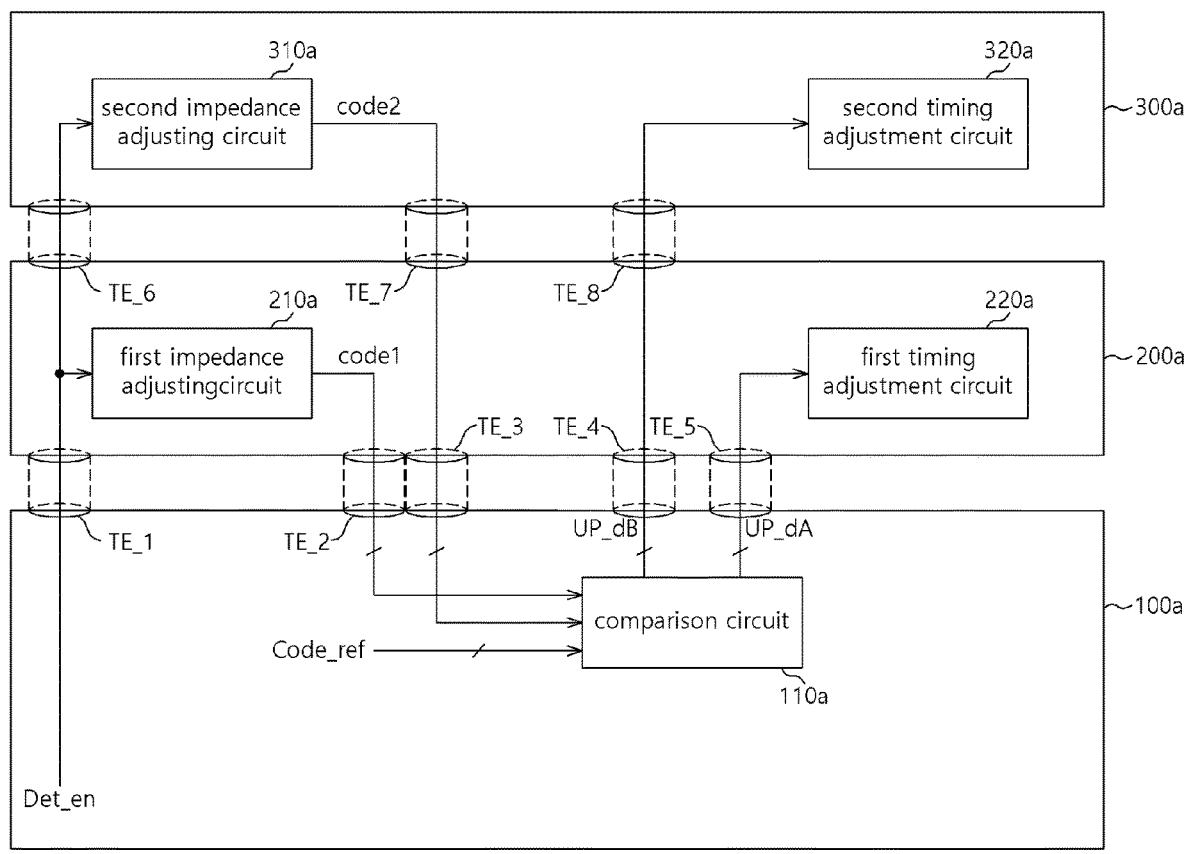
FIG. 5 is a configuration diagram of a semiconductor apparatus in accordance with another embodiment of the present invention.

FIG. 5 is a configuration diagram of a semiconductor apparatus in accordance with another embodiment of the present invention.

The semiconductor apparatus in accordance with another embodiment may include first to third chips 100a, 200a, and 300a as illustrated in FIG. 5.

The first to third chips 100a, 200a, and 300 may be electrically connected to one another through a plurality of through electrodes TE_1 to TE_8, and may be stacked on one another. The first chip 100a may be electrically connected to an external control circuit (for example, a controller), and may electrically connect the external control circuit and the second and third chips 200a and 300b to each other. The through electrodes TE_1 to TE_8 may include all elements that electrically connect chips to one another as with a through-silicon via (TSV), a micro bump and the like.

The first chip 100a may compare each of first and second calibration codes code1 and code2 transferred from the second and third chips 200a and 300a with a reference code Code_ref. The first chip 100a may provide the comparison results to the second and third chips 200a and 300a as first and second update signals UP_dA and UP_dB, respectively. For example, the first chip 100a may compare the first calibration code code1 and the reference code Code_ref with each other, and provide a comparison result to the second chip 200a as the first update signal UP_dA. The first chip 100 may compare the second calibration code code2 and the reference code Code_ref with each other, and provide a comparison result to the third chip 300a as the second update signal UP_dB.

The first chip 100a may include a comparison circuit 110a.

The comparison circuit 110a may compare code values of the reference code Code_ref and the first calibration code code1 with each other, and generate the first update signal UP_dA when the first calibration code code1 has a code value outside a predetermined range with reference to the reference code Code_ref. In such a case, the comparison circuit 110a may generate the first update signal UP_dA having a value corresponding to a difference between the code values of the reference code Code_ref and the first calibration code code1. Furthermore, the comparison circuit 110a may compare the code values of the reference code Code_ref and the second calibration code code2 with each other, and generate the second update signal UP_dB when the second calibration code code2 has a code value outside the predetermined range with reference to the reference code Code_ref. In such a case, the comparison circuit 110a may generate the second update signal UP_dB having a value corresponding to a difference between the code values of the reference code Code_ref and the second calibration code code2.

The second chip 200a may include a first impedance adjusting circuit 210a and a first timing adjustment circuit 220a.

The first impedance adjusting circuit 210a generates the first calibration code code1 when the detection enable signal Det_en is enabled.

The first timing adjustment circuit 220a may control transfer timings of signals travelling within the second chip 200a, in response to the first update signal UP_dA.

The third chip 300a may include a second impedance adjusting circuit 310a and a second timing adjustment circuit 320a.

The second impedance adjusting circuit 310a generates the second calibration code code2 when the detection enable signal Det_en is enabled.

The second timing adjustment circuit 320a may control transfer timings of signals travelling within the third chip 300a, in response to the second update signal UP_dB.

Each of the first and second impedance adjusting circuits 210a and 310a may be implemented with a calibration circuit.

Figure 6:
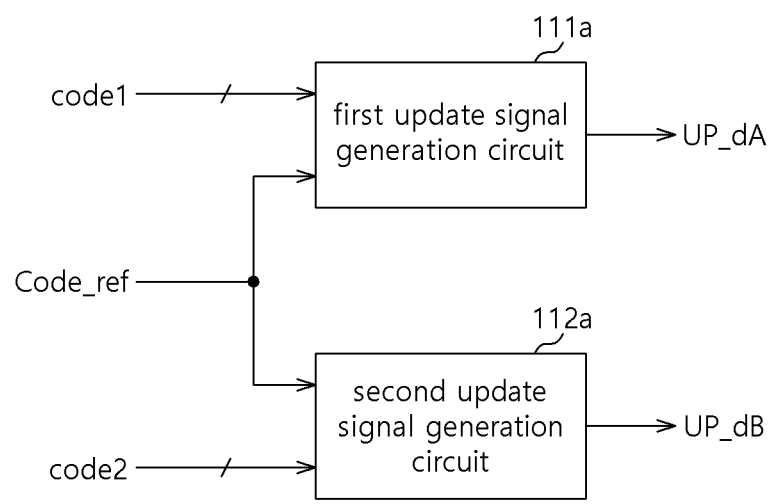
FIG. 6 is a configuration diagram of a comparison circuit of FIG. 5.

FIG. 6 is a configuration diagram of a comparison circuit 110a of FIG. 5.

Referring to FIG. 6, the comparison circuit 110a may include first and second update signal generation circuits 111a and 112a.

The first update signal generation circuit 111a may generate the first update signal UP_dA in response to the difference between the code values of the reference code Code_ref and the first calibration code code1. For example, the first update signal generation circuit 111a may generate the first update signal UP_dA having a value corresponding to the difference between the code values of the first calibration code code1 and the reference code Code_ref.

The second update signal generation circuit 112a may generate the second update signal UP_dB in response to the difference between the code values of the reference code Code_ref and the second calibration code code2. For example, the second update signal generation circuit 112a may generate the second update signal UP_dB having a value corresponding to the difference between the code values of the second calibration code code2 and the reference code Code_ref.

Other than the input/output signals, the first and second update signal generation circuits 111a and 112a may have substantially the same configuration.

FIG. 7 is a configuration diagram of a first update generation circuit 111 of FIG. 6.

Referring to FIG. 7, the first update signal generation circuit 111a may include a code comparison circuit 111a-1, an addition circuit 111a-2, a subtraction circuit 111a-3, a selection circuit 111a-4, and an output control circuit 111a-5.

The code comparison circuit 111a-1 may generate a code comparison signal C_c by comparing the code values of the first calibration code code1 and the reference code Code_ref with each other. For example, the code comparison circuit 111a-1 may output information, as the code comparison signal C_c, on the difference between the code values of the first calibration code code1 and of the reference code Code_ref. The code comparison signal C_c may include information regarding whether which one of the code values of the first calibration code code1 and the reference code Code_ref is large or small and regarding the amount of difference between the code values of the first calibration code code1 and the reference code Code_ref.

The addition circuit 111a-2 may be activated in response to the code comparison signal C_c when the code value of first calibration code code1 is smaller than that of the reference code Code_ref. The addition circuit 111a-2 may generate an addition code A_code in response to the first calibration code code1 and the code comparison signal C_c. For example, the addition circuit 111a-2 may increase the code value of the first calibration code code1 by an amount indicated by the information included in the code comparison signal C_c, that is, the information on the difference between the code values of the first calibration code code1 and the reference code Code_ref, and output the addition code A_code.

The code value of the subtraction circuit 111a-3 may be activated in response to the code comparison signal C_c when the code value of the first calibration code code1 is larger than that of the reference code Code_ref. The subtraction circuit 111a-3 may generate a subtraction code S_code in response to the first calibration code code1 and the code comparison signal C_c. For example, the subtraction circuit 111a-3 may decrease the code value of the first calibration code code1 by an amount indicated by the information included in the code comparison signal C_c, that is, the information on the difference between the code values of the first calibration code code1 and the reference code Code_ref, and output the subtraction code S_code.

The selection circuit 111a-4 may output one of the addition code A_code and the subtraction code S_code as a selection code Sel_code in response to the code comparison signal C_c. For example, the selection circuit 111a-4 may output the addition code A_code as the selection code Sel_code in response to the code comparison signal C_c including information indicating that the code value of the first calibration code code1 is smaller than that of the reference code Code_ref. The selection circuit 111a-4 may output the subtraction code S_code as the selection code Sel_code in response to the code comparison signal C_c including information indicating that the code value of the first calibration code code1 is larger than that of the reference code Code_ref.

The output control circuit 111a-5 may generate the first update signal UP_dA in response to the selection code Sel_code and the detection enable signal Det_en. For example, the output control circuit 111a-5 may generate the first update signal UP_dA by decoding the selection code Sel_code, and output the generated first update signal UP_dA when the detection enable signal Det_en is disabled. The output control circuit 111a-5 may include a decoding circuit that generates the first update signal UP_dA by decoding the selection code Sel_code, and a flip-flop that outputs the generated first update signal UP_dA when the detection enable signal Det_en is disabled.

The first to fifth through electrodes TE_1 to TE_5 may be disposed between the first chip 100a and the second chip 200a, and may transfer signals between the first chip 100a and the second chip 200a. The sixth to eighth through electrodes TE_6 to TE_8 may be disposed between the second chip 200a and the third chip 300a, and may transfer signals between the second chip 200 and the third chip 300a. Through the first and sixth through electrodes TE_1 and TE_6, the detection enable signal Det_en may be transferred from the first chip 100a to the second chip 200a and the third chip 300a. Through the second through electrode TE_2, the first calibration code code1 may be transferred from the second chip 200a to the first chip 100a. Through the third and seventh through electrodes TE_3 and TE_7, the second calibration code code2 may be transferred from the third chip 300a to the first chip 100a via the second chip 200a. Through the fourth and eighth through electrodes TE_4 and TE_8, the second update signal UP_dB may be transferred from the first chip 100a to the third chip 300a via the second chip 200a. Through the fifth through electrode TE_5, the first update signal UP_dA may be transferred from the first chip 100a to the second chip 200.

The first update signal generation circuit 111a of FIG. 6 and FIG. 7 may increase the code value of the first calibration code code1 by an amount of the difference between the first calibration code code1 and the reference code Code_ref when the first calibration code code1 is smaller than the reference code Code_ref, decode the increased code value, and output the decoded code value as the first update signal UP_dA. Furthermore, the first update signal generation circuit 111a may decrease the code value of the first calibration code code1 by an amount of the difference between the first calibration code code1 and the reference code Code_ref when the first calibration code code1 is larger than the reference code Code_ref, decode the decreased code value, and output the decoded code value as the first update signal UP_dA.

Hereinafter, an operation of the semiconductor apparatus configured as above with reference to FIGS. 5 to 7 in accordance with the embodiment of the present invention will be described.

When the detection enable signal Det_en is enabled, the second and third chips 200 and 300 respectively generate the first and second calibration codes code1 and code2 having the code values depending on variations in voltages or temperatures thereof, and transfer the first and second calibration codes code1 and code2 to the first chip 100a.

The first chip 100a compares the code values of the reference code Code_ref and the first calibration code code1 with each other, and provides a comparison result to the second chip 200 as the first update signal UP_dA. Furthermore, the first chip 100a compare the code values of the reference code Code_ref and the second calibration code code2 with each other, and provides a comparison result to the third chip 300a as the second update signal UP_dB.

The second chip 200a controls the transfer timings of signals, which are travelling within the second chip 200a, in response to the first update signal UP_dA.

The third chip 300a controls the transfer timings of signals, which are travelling within the third chip 300, in response to the second update signal UP_dB.

As described above, the semiconductor apparatus in accordance with the embodiment is configured such that each stacked chip generates a calibration code having the code value depending on variations in voltage and temperature when the detection enable signal Det_en is enabled. The semiconductor apparatus compares the calibration code generated in each chip with a preset reference code which is stable regardless of voltage and temperature, that is, determines the degree of a change in the code value of the calibration code of each chip, and generates an update signal to be provided to each chip according to the change.

Accordingly, the update signal may be generated as a signal having information corresponding to the variations in voltage or temperature. Each chip having received the update signal is configured to set the transfer timings (a delay time, latency and the like) of internal signals again in response to the information of the update signal.

As a result, the semiconductor apparatus described with reference to FIGS. 1 to 7 in accordance with the present invention can allow the operation speeds of the stacked chips to be constant, thereby improving operation performance of the semiconductor apparatus and simultaneously reducing current consumption thereof.

While various embodiments have been described above, it will be understood to those skilled in the art that the embodiments described are examples only. Accordingly, the semiconductor apparatus described herein should not be limited based on the described embodiments.

What is claimed is:

1. A semiconductor apparatus comprising:
a first chip configured to generate a first oscillator signal in response to a detection enable signal and to activate a impedance adjusting circuit in response to a enable signal; and
a second chip configured to generate the enable signal by comparing frequencies of the first oscillator signal and a second oscillator signal with each other in response to the detection enable signal.

2. The semiconductor apparatus according to claim 1, wherein the first chip comprises:
an oscillator configured to generate the first oscillator signal in response to the detection enable signal; and
a timing adjustment circuit configured to increase or decrease a transfer time of a signal travelling within the first chip, in response to a calibration code
wherein the impedance adjusting circuit is configured to generate the calibration code in response to the enable signal.

3. The semiconductor apparatus according to claim 1, wherein the first oscillator signal has a frequency depending on a temperature and a voltage, and the second oscillator signal has a frequency regardless of temperature and voltage.

4. The semiconductor apparatus according to claim 3, wherein the second chip comprises:
an oscillator configured to generate the second oscillator signal; and
a comparison circuit configured to generate the enable signal by comparing the frequencies of the first oscillator signal and the second oscillator signal with each other in response to the detection enable signal.

5. The semiconductor apparatus according to claim 4, wherein the comparison circuit comprises:
a first TDC(time digital converter) circuit configured to generate a first period code in response to the first oscillator signal;
a second TDC circuit configured to generate a second period code in response to the second oscillator signal;
a subtraction circuit configured to generate a subtraction code by performing a subtraction operation on the first period code and the second period code; and
a code comparison circuit configured to generate the enable signal by comparing an offset code and the subtraction code with each other.

6. The semiconductor apparatus according to claim 5, wherein the first TDC circuit is configured to generate the first period code by converting a duration of a specific level of the first oscillator signal into a code, and
the second TDC circuit is configured to generate the second period by converting a duration of a specific level of the second oscillator signal into the code.

7. The semiconductor apparatus according to claim 5, wherein the code comparison circuit enables the enable signal when a code value of the subtraction code is larger than a code value of the offset code, and disables the enable signal when the code value of the subtraction code is smaller than the code value of the offset code.

8. A semiconductor apparatus comprising:
a first chip configured to generate a first oscillator signal; and
a second chip stacked on the first chip, configured to generate a second oscillator signal;
wherein the first chip is configured to generate a first oscillator signal, compare the second oscillator signal and the first oscillator signal with each other, and output a comparison result to the second chip, and
wherein the first and second chips are electrically connected to each other by at least one through electrode,
wherein the second chip comprises:
a second oscillator configured to generate the second oscillator signal;
a circuit configured to generate a calibration code in response to the comparison result outputted from the first chip; and a timing adjustment circuit configured to control a transfer time of a signal travelling within the second chip, in response to the calibration code.

9. The semiconductor apparatus according to claim 8, wherein the first chip comprises:
a first oscillator configured to generate the first oscillator signal; and
a comparison circuit configured to generate the comparison result by comparing frequencies of the first oscillator signal and the second oscillator signal with each other.

10. A semiconductor apparatus comprising:
a first chip configured to generate a calibration code in response to a detection enable signal and to control a signal transfer time in the first chip in response to an update signal; and
a second chip configured to generate the update signal by comparing a reference code and the calibration code with each other.

11. The semiconductor apparatus according to claim 10, wherein the second chip generates the update signal having a value corresponding to a difference between code values of the reference code and the calibration code.

12. The semiconductor apparatus according to claim 11, wherein the second chip comprises:
a code comparison circuit configured to generate a code comparison signal by comparing the calibration code and the reference code with each other;
an addition circuit configured to generate an addition code in response to the calibration code and the code comparison signal;
a subtraction circuit configured to generate a subtraction code in response to the calibration code and the code comparison signal;
a selection circuit configured to output one of the addition code and the subtraction code as a selection code in response to the code comparison signal; and
an output control circuit configured to output the selection code as the update signal in response to the detection enable signal.

13. The semiconductor apparatus according to claim 12, wherein
the code comparison signal includes information on a difference between code values of the calibration code and the reference code.

14. The semiconductor apparatus according to claim 12, wherein the addition circuit increases the calibration code based on information on a difference between code values of the calibration code and the reference code, thereby outputting the increased calibration code as the addition code.

15. The semiconductor apparatus according to claim 12, wherein the subtraction circuit decreases the calibration code by information on a difference between code values of the calibration code and the reference code, thereby outputting the decreased calibration code as the subtraction code.

16. The semiconductor apparatus according to claim 12, wherein the output control circuit decodes the selection code and outputs a decoded result as the update signal in response to the detection enable signal.

17. A semiconductor apparatus comprising:
a first chip; and
a second chip configured to be electrically connected to the first chip by at least one through electrode;
wherein the first chip is configured to compare a calibration code generated from the second chip and a reference code with each other and to output a comparison result to the second chip, and
wherein the second chip comprises:
an impedance adjusting circuit configured to generate the calibration code in response to a detection enable signal; and
a timing adjustment circuit configured to control a transfer time of a signal, which is travelling within the second chip, according to the comparison result transferred from the first chip.

18. A semiconductor apparatus comprising:
a first chip; and
a second chip configured to be electrically connected to the first chip by at least one through electrode;
wherein the first chip is configured to compare a calibration code generated from the second chip and a reference code with each other and to output a comparison result to the second chip, and
wherein the first chip comprises:
a code comparison circuit configured to generate a code comparison signal by comparing the calibration code and the reference code with each other;
an addition circuit configured to generate an addition code in response to the calibration code and the code comparison signal;
a subtraction circuit configured to generate a subtraction code in response to the calibration code and the code comparison signal;
a selection circuit configured to output one of the addition code and the subtraction code as a selection code in response to the code comparison signal; and
an output control circuit configured to output the selection code as the comparison result in response to the detection enable signal.

* * * * *